United States Patent
Okada (10) Patent No.: US 6,774,350 B2
(45) Date of Patent: Aug. 10, 2004

(54) SOLID STATE IMAGING DEVICE AND METHOD FOR DRIVING SOLID STATE IMAGING DEVICE

(75) Inventor: Yoshihiro Okada, Hashima (JP)

(73) Assignee: Sanyo Electric Co., Ltd., Osaka (JP)

(*) Notice: Subject to any disclaimer, the term of this patent is extended or adjusted under 35 U.S.C. 154(b) by 61 days.

(21) Appl. No.: 10/150,226

(22) Filed: May 17, 2002

(65) Prior Publication Data

US 2002/0171033 A1 Nov. 21, 2002

(30) Foreign Application Priority Data

May 18, 2001 (JP) ........................................ 2001-149454

(51) Int. Cl.[7] .............................................. H01L 27/00
(52) U.S. Cl. ..................... 250/208.1; 348/311; 348/314
(58) Field of Search ....................... 250/208.1; 348/280, 348/311, 314

(56) References Cited

U.S. PATENT DOCUMENTS 5,486,859 A * 1/1996 Matsuda ..................... 348/311
5,856,845 A * 1/1999 Murata et al. ............... 348/312
5,874,993 A * 2/1999 Ciccarelli et al. ........... 348/294

* cited by examiner

Primary Examiner—David Porta
Assistant Examiner—Patrick J. Lee
(74) Attorney, Agent, or Firm—Sheridan Ross PC

(57) ABSTRACT

A solid state imaging device that optimally thins out charges in the horizontal direction even when performing color imaging. The solid state imagine device includes pixels for storing the charges, a horizontal shift register, an output circuit, and a drain section. The horizontal shift register includes bit regions for retrieving the charges transferred from the vertical shift registers. The horizontal shift register thins out the information charges accumulated in the pixels at a ratio of m/n (m, n both being natural numbers and satisfying m<n) and horizontally transfers the thinned out charges. The drain section is connected to a k·(n−m) (k being a natural number) number of the bit regions in a k·n number of bit regions. The horizontal shift register transfers the information charges of the k·(n−m) number of the bit regions to the drain section.

5 Claims, 10 Drawing Sheets

SOLID STATE IMAGING DEVICE AND METHOD FOR DRIVING SOLID STATE IMAGING DEVICE

BACKGROUND OF THE INVENTION

The present invention relates to a solid state imaging device having a plurality of light receiving pixels arranged in a matrix-like manner and a method for driving such solid state imaging device.

In an imaging device, such as a digital camera, a preview of a captured image is shown as a dynamic image. The resolution of a preview does not have to be as high as a still image. Thus, image signals, which are output from a solid state imaging device, are thinned out to generate the dynamic image.

Figure 1:
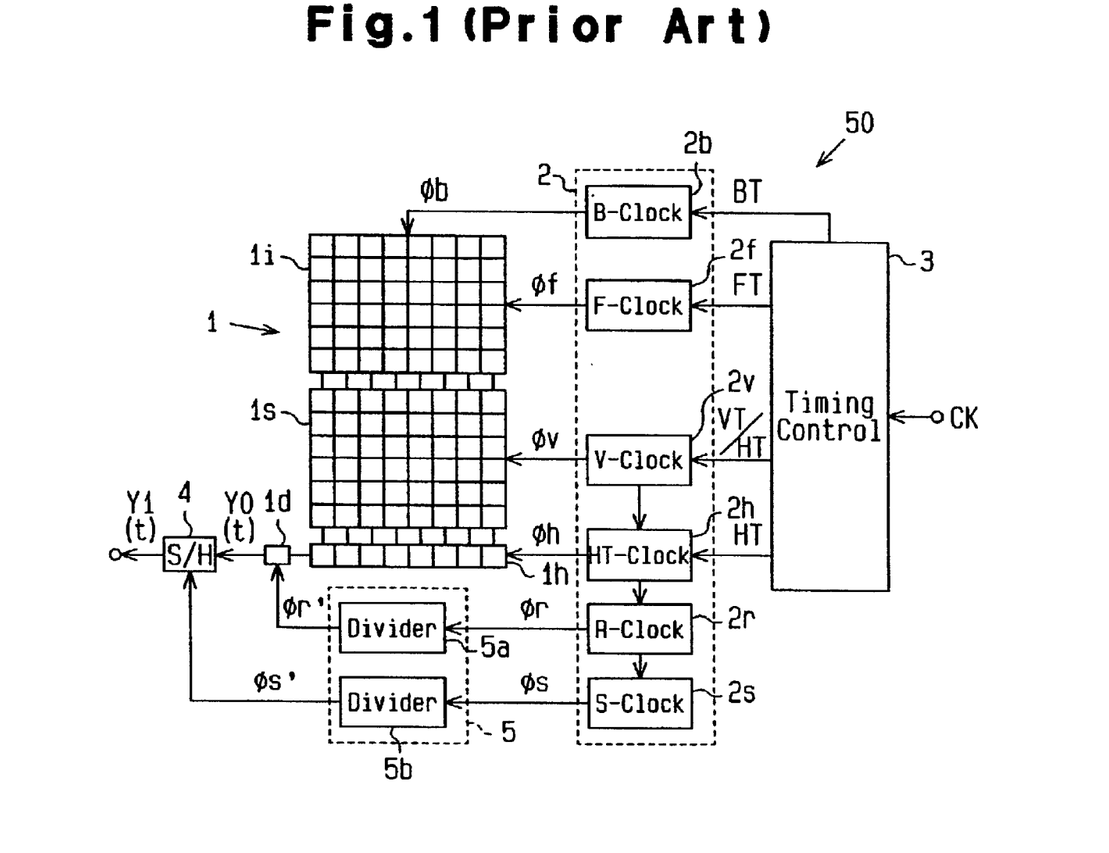
FIG. 1 is a schematic block diagram of a prior art imaging device.
Figure 2:
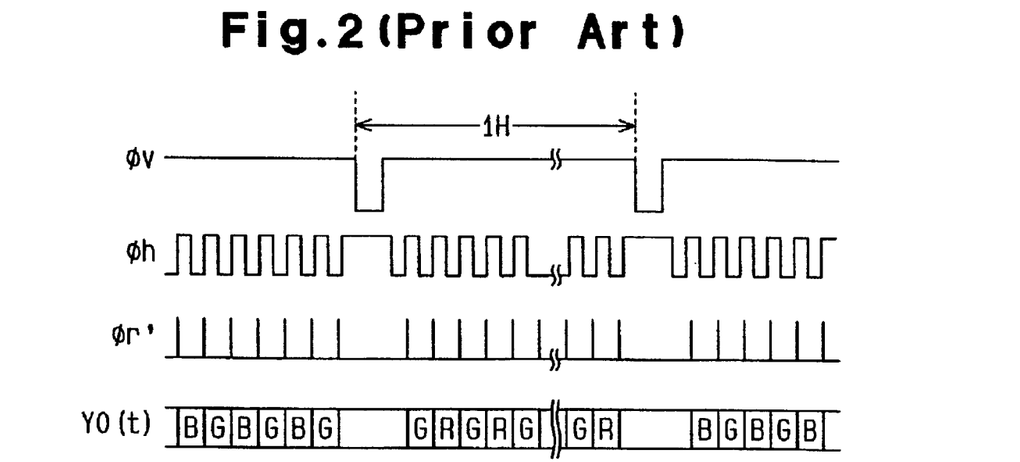
FIG. 2 is a timing chart illustrating the operation of the imaging device of FIG. 1.

FIG. 1 is a schematic circuit block diagram of a prior art imaging device 50. FIG. 2 is a timing chart illustrating the horizontal transfer and output operation of the imaging device 50. FIG. 1 shows a solid state imaging device 1 having a matrix formed by six rows and eight columns. The solid state imaging device 1 has a light receiving portion for generating information charges. An output section 1d of the solid state imaging device 1 synthesizes a predetermined amount of the information charges to thin out the image signals.

The solid state imaging device 1 is, for example, a frame transfer type device. The solid state imaging device 1 includes a light receiving portion 1i for receiving a captured image and generating information charges, a storage portion 1s for temporarily storing the generated information charges, a horizontal shift register 1h for transferring the information charges in the row (horizontal) direction, and the output section 1d for converting the information charges to a voltage having a value that is in accordance with the charge amount of the information charges.

The drive circuit 2 includes a frame transfer clock generation circuit 2f, a vertical transfer clock generation circuit 2v, a horizontal clock generation circuit 2h, a reset clock generation circuit 2r, a sampling clock generation circuit 2s, and a substrate clock generation circuit 2b.

In response to a frame transfer timing signal FT, the frame transfer clock generation circuit 2f generates, for example, a frame transfer clock $\Phi f$ having four phases and provides the frame transfer clock $\Phi f$ to the light receiving portion 1i. Information charges for a single screen image, which are accumulated in light receiving pixels of the light receiving portion 1i, are transferred to the storage portion 1s in accordance with the frame transfer clock $\Phi f$ and in synchronism with a vertical scanning period.

In response to a vertical synchronizing signal VT and a horizontal synchronizing signal HT, the vertical transfer clock generation circuit 2v generates, for example, a vertical transfer clock $\Phi v$ having four phase and provides the vertical transfer clock $\Phi v$ to the storage portion 1s. The information charges received from the light receiving portion 1i are temporarily accumulated in the storage portion 1s in accordance with the vertical transfer clock $\Phi v$ and in synchronism with a frame transfer timing. The accumulated information charges are provided to the horizontal shift register 1h in units of rows for each horizontal scanning period 1H.

In response to the horizontal synchronizing signal HT, the horizontal transfer clock generation circuit 2h generates, for example, a transfer clock $\Phi h$ having two phases and provides the frame transfer clock $\Phi h$ to the horizontal shift register 1h. The information charges corresponding to a single row, which is received in each bit register of the horizontal shift register 1h, is provided to the output section 1d sequentially in units of single pixels.

The reset clock generation circuit 2r generates a reset clock $\Phi r$ in synchronism with the horizontal transfer clock generation circuit 2h and provides the reset clock $\Phi r$ to the output section 1d. The information charges transferred from the horizontal shift register 1h in units of single pixels are converted to a voltage having a value that is in accordance with the charge amount in response to the reset clock $\Phi r$ and sequentially output.

In the same manner as the reset clock generation circuit 2r, the sampling clock generation circuit 2s generates the sampling clock $\Phi s$ in synchronism with the operation of the horizontal transfer clock generation circuit 2h and provides the sampling clock $\Phi s$ to the sample hold circuit 4. In accordance with the sampling clock $\Phi s$ and in synchronism with the horizontal scanning period, among the reset level and the signal level, which are repeated in an image signal $Y0(t)$, only the signal level is extracted to generate an image signal $Y1(t)$ having consecutive signal levels.

In response to a drain timing signal BT, the substrate clock generation circuit 2b generates a substrate clock $\Phi b$ that disposes of information charges accumulated in the light receiving portion 1i and provides the substrate clock $\Phi b$ to a substrate side of the solid state imaging device 1.

The timing control circuit operates in accordance with a reference clock CK having a constant cycle. The timing control circuit 3 generates the vertical synchronizing signal VT and the horizontal synchronizing signal HT, which determine the vertical and horizontal scanning timing of the solid state imaging device 1, and generates a frame transfer timing signal FT at a cycle coinciding with the vertical synchronizing signal VT. The timing control circuit 3 generates the drain timing signal BT in accordance with integral data that represents the integral value of a single screen image provided from a digital signal processing circuit (not shown) or the integral value of an arbitrary section.

The drain timing signal BT is provided to the drive circuit 2 together with the vertical synchronizing signal VT, the horizontal synchronizing signal HT, and the frame transfer timing signal FT. The drain timing signal BT delays the drain timing when the integral data exceeds a value that is adequate for shortening the storage time of the information charges. On the other hand, the drain timing signal BT advances the drain timing when the integral value becomes smaller than the adequate value to lengthen the storage time. To optimize the exposure state of the solid state imaging device 1, feedback control is performed in accordance with the drain timing signal BT.

A dividing circuit 5 includes a first divider 5a for dividing the sampling clock $\Phi s$ and a second divider 5b for dividing the reset clock $\Phi r$. The dividing circuit 5 divides the reset clock $\Phi r$ and the sampling clock $\Phi s$ when necessary. The output section 1d is operated intermittently in accordance with the divided reset clock $\Phi r$ and the divided sampling clock $\Phi s$ to mix information charges.

For example, when the cycle of the reset clock $\Phi r$, the cycle of which is the same as that of the horizontal transfer clock $\Phi h$, is divided by ½, a reset clock $\Phi r'$ having a cycle that is two times longer is generated. The reset clock $\Phi r'$ resets the information charges whenever information charges for two pixels are accumulated in the output section 1d. This synthesizes the information charges for two pixels, which are arranged adjacent to each other in the horizontal direction, and thins out the information charges.

In the prior art imaging device 50, a color filter is attached to the light receiving portion 1i when performing color imaging. The color filter includes a plurality of different segments corresponding to the three primary colors and their auxiliary colors. The segments are arranged in a two dimensional manner and correspond in a regular manner with each light receiving pixel. In the color imaging solid state imaging device 1 that associates certain color components with each light receiving pixel, the color components of the light receiving pixels adjacent to each other in the horizontal direction are different. Thus, the information charges of pixels in the horizontal direction cannot be synthesized.

For example, when using a mosaic color filter having three color components R (red), G, (green), and B (blue), referring to FIG. 2, the generated image signal $Y0(t)$ has the color components R and G, which are alternately repeated in synchronism with the horizontal transfer clock Φh, or the color components B and G, which are also alternately repeated in synchronism with the horizontal transfer clock Φh. Thus, when the information charges of adjacent light receiving pixels are synthesized in a transfer stage, different color components are mixed together. Thus, the desired color cannot be obtained at the reproducing side.

SUMMARY OF THE INVENTION

It is an object of the present invention to provide a solid state imaging device that optimally thins out information charges in the horizontal direction even during color imaging.

To achieve the above object, the present invention provides a solid state imaging device including a light receiving section including a plurality of light receiving pixels. The light receiving pixels are arranged in rows and columns in a matrix-like manner and accumulate information charges. A plurality of vertical shift registers are connected to the light receiving section for transferring the information charges accumulated in the light receiving pixels in a vertical direction. A horizontal shift register is connected to the vertical shift registers and includes a plurality of bit regions. The bit regions receive information charges transferred from the vertical shift registers, and the horizontal shift register transfers the information charges accumulated in the light receiving pixels in a horizontal direction at a ratio of m/n (m, n both being natural numbers and satisfying m<n). An output section is connected to an output of the horizontal shift register. The output section receives the information charges transferred in the horizontal direction and generates an image signal having a voltage corresponding to the charge amount of the information charges. A drain section is connected to the horizontal shift register for collecting the information charges received in the horizontal shift register. The drain section is connected to a k·(n−m) (k being a natural number) number of the bit regions in a k·n number of bit regions of the horizontal shift register, and the horizontal shift register transfers the information charges of the k·(n−m) number of the bit regions in the k·n number of bit regions to the drain section.

A further perspective of the present invention is a solid state imaging device including a light receiving section including a plurality of light receiving pixels. The light receiving pixels are arranged in rows and columns in a matrix-like manner and accumulate information charges. A plurality of vertical shift registers are connected to the light receiving section for transferring the information charges accumulated in the light receiving pixels in a vertical direction. A horizontal shift register is connected to the vertical shift registers and includes a plurality of bit regions. The bit regions receive information charges transferred from the vertical shift registers, and the horizontal shift register transfers the received information charges in a horizontal direction. An output section is connected to an output of the horizontal shift register. The output section receives the information charges transferred in the horizontal direction and generates an image signal having a voltage corresponding to the charge amount of the information charges. A drain section is connected to the horizontal shift register for collecting the information charges received in the horizontal shift register. The drain section is connected to some of the bit regions of the horizontal shift register. The horizontal shift register transfers the information charges of the some of the bit regions to the drain section and transfers the information charges of the remaining bit regions to the output section.

A further perspective of the present invention is a method for driving a solid state imaging device including a plurality of light receiving pixels. The light receiving pixels are arranged in rows and columns in a matrix-like manner and accumulate information charges. The solid state imaging device thins out the information charges in a horizontal direction at a ratio of m/n (m, n both being natural numbers and satisfying m<n) and outputs the thinned out information charges. The solid state imaging device includes a plurality of vertical shift registers. A horizontal shift register has a plurality of bit regions connected to the vertical shift registers. An output section is connected to an output of the horizontal shift register, and a drain section is connected to a k(n−m) (k being a natural number) number of bit regions in a k·n number of the bit regions of the horizontal shift register. The method includes receiving the information charges accumulated in the light receiving pixels with the vertical shift registers, vertically transferring the information charges received in the vertical shift registers to the horizontal shift register in units of single rows, transferring the information charges of the k·(n−m) number of bit regions in the k·n number of the bit regions to the drain section, and horizontally transferring the information charges of a k·n number of the bit regions in the k·n number of the bit regions to the output section.

A further perspective of the present invention is a method for driving a solid state imaging device including a plurality of light receiving pixels. The light receiving pixels are arranged in rows and columns in a matrix-like manner and accumulate information charges. The solid state imaging device thins out the information charges in a horizontal direction at a predetermined ratio. The solid state imaging device includes a plurality of vertical shift registers, a horizontal shift register having a plurality of bit regions connected to the vertical shift registers, an output section connected to an output of the horizontal shift register, and a drain section connected to some of the bit regions of the horizontal shift register. The method includes receiving the information charges accumulated in the light receiving pixels with the vertical shift registers, vertically transferring the information charges received in the vertical shift registers to the horizontal shift register in units of single rows, transferring the information charges of the some of the bit regions to the drain section, and horizontally transferring the information charges of remaining ones of the bit regions after excluding the some of the bit regions to the output section.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 3:
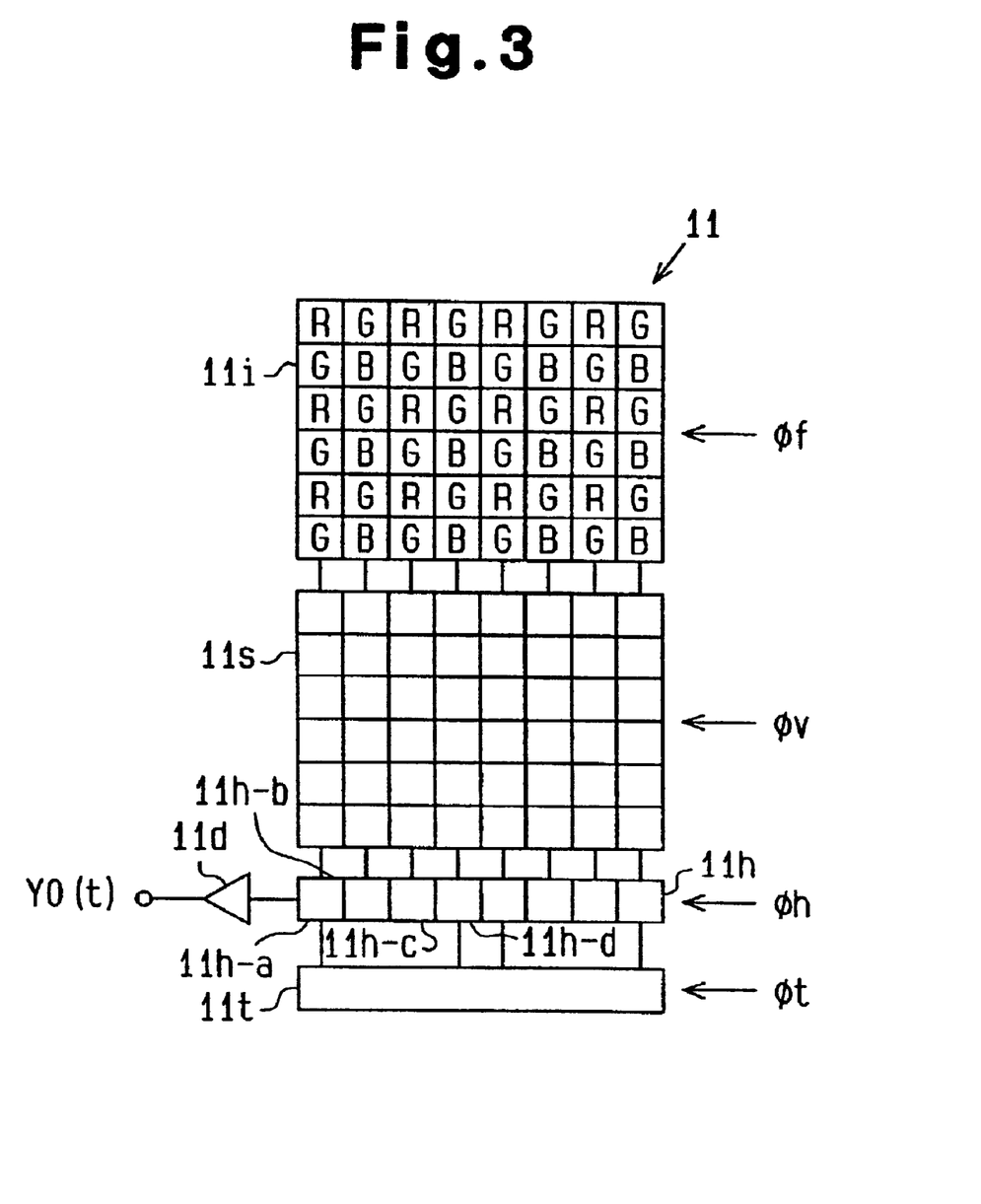
FIG. 3 is a schematic plan view of a solid state imaging device according to a preferred embodiment of the present invention.

FIG. 3 is a schematic plan view of a solid state imaging device 11 according to a preferred embodiment of the present invention. The solid state imaging device 11 may be a frame transfer type solid state imaging device or a interline type solid state imaging device. In the preferred embodiment, the solid state imaging device 11 is a frame transfer type solid state imaging device. Information charges are generated at a plurality of light receiving pixels and associated with a k number (k representing a natural number) of color components in each row of the light receiving pixels. The solid state imaging device 11 thins out the information charges generated at the light receiving pixels at a ratio of m/n (m, n being natural numbers and satisfying m<n).

The solid state imaging device 11 includes a light receiving section 11i, a storage section (vertical shift register) 11s, a horizontal shift register 11h, and a drain section 11t. The light receiving section 11i includes a plurality of light receiving pixels arranged in a matrix-like manner. FIG. 3 shows the light receiving section 11i having a matrix formed by six rows and eight columns. In the preferred embodiment, two (k=2) color components are associated with each row of the light receiving pixels. An example in which the information pixels generated at the plurality of light receiving pixels are thinned out at a ratio of ½ (m=1, n=2) will now be discussed.

The light receiving section 11i has a plurality of (eight in FIG. 3) vertical shift registers that are arranged parallel to one another. Each vertical shift register has a plurality of (six in FIG. 3) of vertical bit regions, and each vertical bit region defines a light receiving pixel.

A mosaic color filter including, for example, three color components R, G, B are attached to the light receiving section 11i. Each color component is associated with each light receiving element in a predetermined order. For example, odd number rows of the light receiving pixels are alternately associated with the color component R and the color component B, and even number rows of the light receiving pixels are alternately associated with the color component G and the color component B. The light receiving section 11i is provided with a frame transfer clock $\Phi f$, which is synchronized with the vertical scanning timing. The frame transfer clock $\Phi f$ is transferred to the storage section 11s in accordance with the information charges generated at each light receiving pixel.

The storage section 11s includes a plurality of (eight in FIG. 3) vertical shift registers, which are connected with the vertical shift registers of the light receiving section 11i. Further, the storage section 11s receives information charges of a single screen image provided from the vertical shift registers of the light receiving section 11i. Each vertical shift register of the storage section 11s includes a plurality of (six in FIG. 3) of vertical bit regions. Each vertical bit region temporarily accumulates the information charges generated in each light receiving pixel. The storage section 11s includes a vertical transfer clock $\Phi v$ and outputs the information charges received from the light receiving section 11i in the vertical direction and in units of single rows synchronized with the horizontal scanning timing.

The horizontal shift register 11h includes a plurality of (eight in FIG. 3) of bit regions. Each bit region is associated with one of the columns of the storage section 11s. The horizontal shift register 11h receives a horizontal transfer clock $\Phi h$, which is synchronized with the horizontal scanning timing. The horizontal shift register 11h receives information charges from the storage section 11s and transfers the information charges in the horizontal direction.

The output section 11d is arranged at the output side of the horizontal shift register 11h and includes a capacitor for receiving information charges provided from the horizontal shift register 11h. The output section 11d converts the information charges to a voltage having a value corresponding to the charge amount of the information charges to generate image signals Y0(t). The image signals Y0(t) are sequentially output from the output section 11d.

Among four bit regions (11h–a to 11h–d) of the horizontal shift register 11h, two bit regions (11h–a and 11h–c) correspond to the same color component. Among the two bit regions (11h–a and 11h–c), one bit region (11h–a) is connected to the drain section 11t. Two of the bit regions (11h–b and 11h–d) correspond to another single color component, and one bit region (11h–d) is connected to the drain section 11t. The information charges accumulated in the bit regions connected to the drain section are transferred to the drain section 11t.

In the horizontal shift register 11h, for every four (k·n=4) bit regions, two (k·(n−m)=2) bit regions are connected to the drain section 11t. Thus, the information charges accumulated in the connected bit regions are disposed of. This thins out the information charges of each single row, which is received in the horizontal shift register 11h, at a ratio of ½ (m/n).

When the solid state imaging device 11 is for monochrome imaging (k=1) and the generated information charges are thinned out at a ratio of ½ (m=1, N=2), one (k·(n−M)=1) of two (k·n=2) consecutive bit regions in the horizontal shift register 11$h$ is connected to the drain section 11$t$, and the information charges accumulated in the connected bit region is transferred to the drain section 11$t$.

The drain section 11$t$ includes a drain region, which collects predetermined information charges of the information charges received in the horizontal shift register 11$h$, and a control gate, which control the transfer of information charges to the drain region. The drain section 11$t$ receives a drain clock Φt, which is synchronized with the horizontal synchronizing signal HT, and receives predetermined information charges in response to the drain clock Φt.

Figure 4:
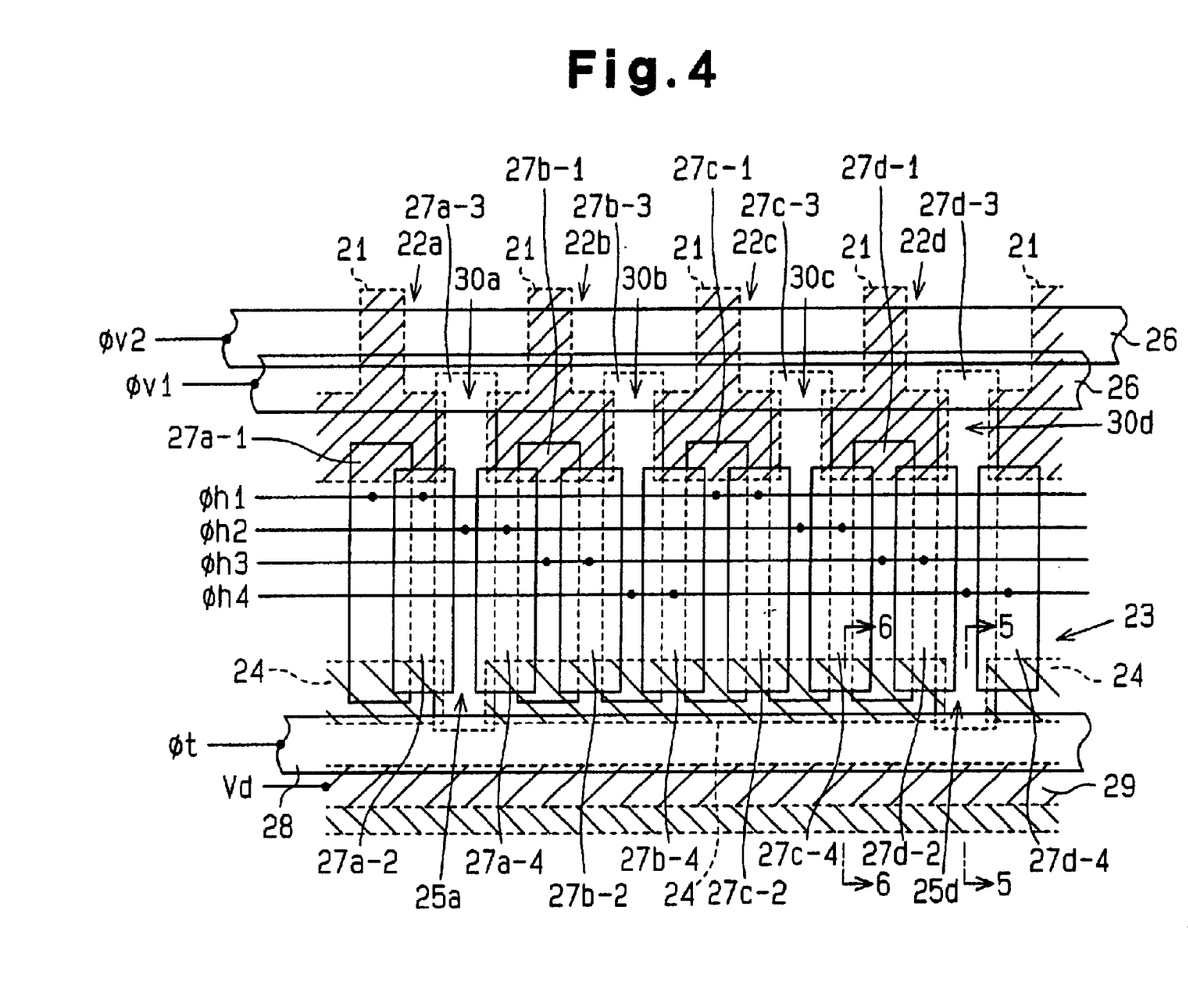
FIG. 4 is a schematic plan view showing a section connecting a horizontal shift register and drain section of the solid state imaging device of FIG. 3.

FIG. 4 is a plan view showing an example of a section connecting the storage section 11$s$ and the horizontal shift register 11$h$ and a section connecting the horizontal shift register 11$h$ and the drain section 11$t$.

A high-concentration P-type region, which includes a plurality of separation regions 21, is applied to a P-type region, which is formed on a silicon substrate. In the surface regions located between the separation regions 21, N-type impurities are diffused to form vertical transfer channels 22$a$, 22$d$, which extend parallel to each other in the vertical direction. N-type impurities are dispersed continuously on the output terminals of the vertical transfer channels 22$a$–22$d$ to form connection channels 30$a$–30$d$. N-type impurities are dispersed continuously on the connection channels 30$a$–30$d$ to form a horizontal transfer channel 23. The horizontal transfer channel 23 is defined by separation regions 24 formed in the high concentration P-type region and extend horizontally.

N-type impurities are dispersed in the vertical direction of the horizontal transfer channel 23 continuously with the horizontal transfer channel 23 to form drain channels 25$a$, 25$d$. The drain channel 25$a$ corresponds to the vertical transfer channel 22$a$, and the drain channel 25$b$ corresponds to the vertical transfer channel 22$d$. A drain region 29, which is formed from a high-concentration N-type dispersion region, is formed at the output side of the drain channels 25$a$, 25$d$. The drain region 29 is arranged adjacent to the output side of the drain channels 25$a$, 25$d$ and extend horizontally. The drain channels 25$a$ and 25$d$ are supplied with a drain voltage Vd.

A plurality of vertical transfer electrodes 26 having double-layer structures are arranged on the vertical transfer channels 22$a$–22$d$ extending horizontally and parallel to each other in an insulated state. The vertical transfer electrodes 26 are provided with, for example, four-phase vertical transfer clocks Φv1–Φv4. A total of four of the vertical transfer electrodes 26 form a single light receiving pixel on each column of the first vertical transfer channels 22$a$–22$d$ and vertically transfer the information charges accumulated in each light receiving pixel one pixel at a time.

A plurality of horizontal transfer electrodes 27$a$–27$d$ having double-layer structures are arranged on the horizontal transfer channel 23$s$ 22$a$–22$d$ parallel to each other in an insulated state. Among the horizontal transfer electrodes 27$a$–27$d$, the odd number transfer electrodes 27$a$-1, 3, 27$b$-1, 3, 27$c$-1, 3, 27$d$-1, 3 form a lower layer transfer electrode. To cover part of the lower transfer electrode, the even number transfer electrodes 27$a$-2, 4, 27$b$-2, 4, 27$c$-2, 4, 27$d$-2, 4 form an upper layer transfer electrode.

The horizontal transfer electrodes 27$a$-1–27$d$-4 are provided with four-phase vertical transfer clocks Φh1–Φh4.

The transfer electrodes 27$a$-1, 2 and 27$c$-1, 2 are connected to the same line and both receive the same horizontal transfer clock Φh1. The transfer electrodes 27$a$-3, 4 and 27$c$-3, 4 are connected to the same line and both receive the horizontal transfer clock Φh2. The transfer electrodes 27$b$-1, 2 and 27$d$-1, 2 are connected to the same line and both receive the horizontal transfer clock Φh3. The transfer electrodes 27$b$-3, 4 and 27$d$-3, 4 are connected to the same line and both receive the horizontal transfer clock Φh4.

In the horizontal transfer electrode formed in the lower layer, the transfer electrodes 27$a$-3, 27$b$-3, 27$c$-3, 27$d$-3 extend toward the vertical channels 22$a$–22$d$ to cover connection channels 30$a$–30$d$. Among the horizontal transfer electrodes 27$a$-3–27$d$-3, the transfer electrodes 27$a$-3 and 27$d$-3 are longer than the other transfer electrodes to cover the drain channels 25$a$–25$d$.

In the drain region 29 side of the horizontal transfer electrodes 27$a$-3, 27$d$-3, a control electrode 28 extends in the horizontal direction. The control electrode 28 is provided with the drain clock Φt, which is synchronized with the vertical transfer clock Φv. The information charges, which are transferred to the channel region below the horizontal transfer electrodes 27$a$-3, 27$d$-3, are transferred to the drain region 29. Among the information charges received in each bit region of the horizontal shift register, the information charges of one half of the information charges received in each bit region are disposed of and the information charges of the remaining half of the bit regions are accumulated in the horizontal transfer channel 23. In this state, among the information charges received in the two bit regions corresponding to the same color component, only the information charges received in one of the bit regions is discharged. This uniformly thins out the information charges corresponding to each of the two color components G, B.

Figure 5:
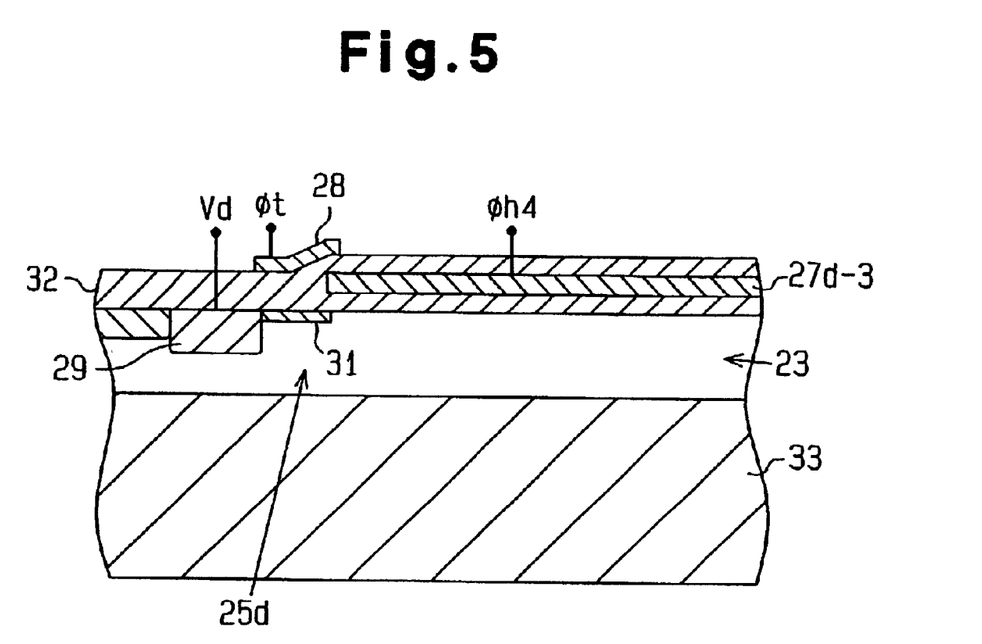
FIG. 5 is a cross-sectional view taken along line 5—5 in FIG. 4.

FIG. 5 is a cross-sectional view taken along line 5—5 in FIG. 4 and show a section where the drain channel 25$d$ connects the horizontal transfer channel 23 and the drain region 29.

An N-type region (horizontal transfer channel) 23 is applied to the surface of the P-type region formed on a silicon substrate 33. An N-type region (drain channel) 25$d$ is formed continuously with the horizontal transfer channel 23. An N-type region 31 having a concentration that is lower than that of the drain channel 25$d$ is applied to the surface of the drain channel 25$d$. An N-type region (drain region) 29, the concentration of which is higher than that of the drain channel 25$d$, is formed adjacent to the region 31.

A lower layer horizontal transfer electrode 27$d$-3 is applied to the surface of the horizontal transfer channel 23 by way of an insulation layer formed from an oxide film of SiO$_2$ or the like. The control electrode 28 is formed on an upper layer by way of an insulation layer 32.

Figure 6:
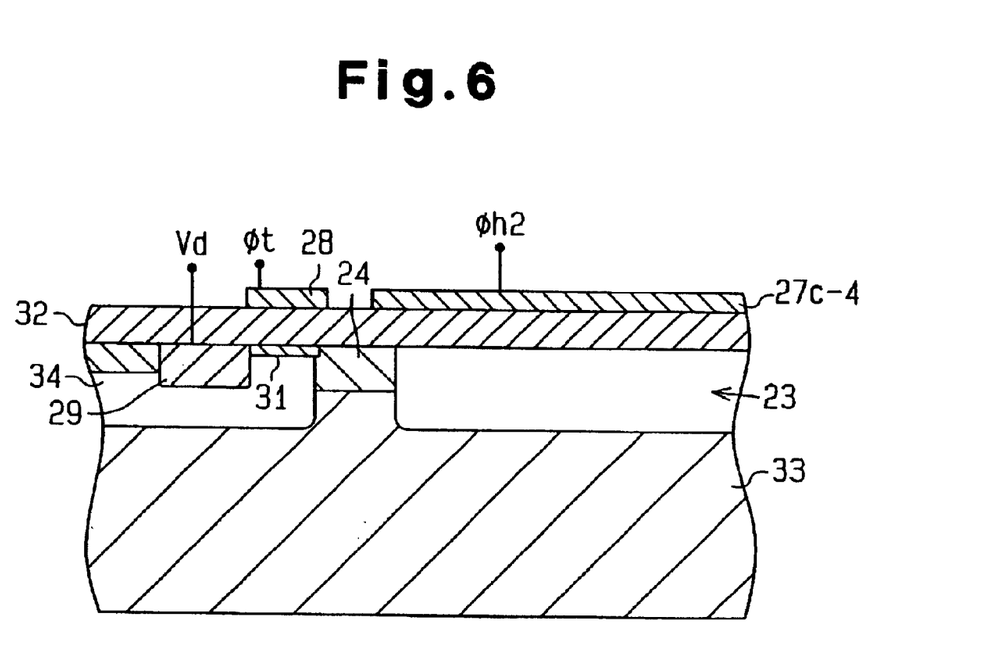
FIG. 6 is a cross-sectional view taken along line 6—6 in FIG. 4.

FIG. 6 is a cross-sectional view taken along line 6—6 in FIG. 4 and show a section where the separation regions 24 separate the horizontal transfer channel 23 and the separation region 24.

A high-concentration P-type region is formed adjacent to the horizontal transfer channel 23, which is formed on the silicon substrate, to form the separation region 24. A drain side channel region 34 is formed so that the horizontal transfer channel 23 is separated from the separation region 24. The upper side horizontal transfer electrode 27$c$-4 is formed on the surface of the horizontal transfer channel 23 by way of the insulation layer 32.

Figure 7:
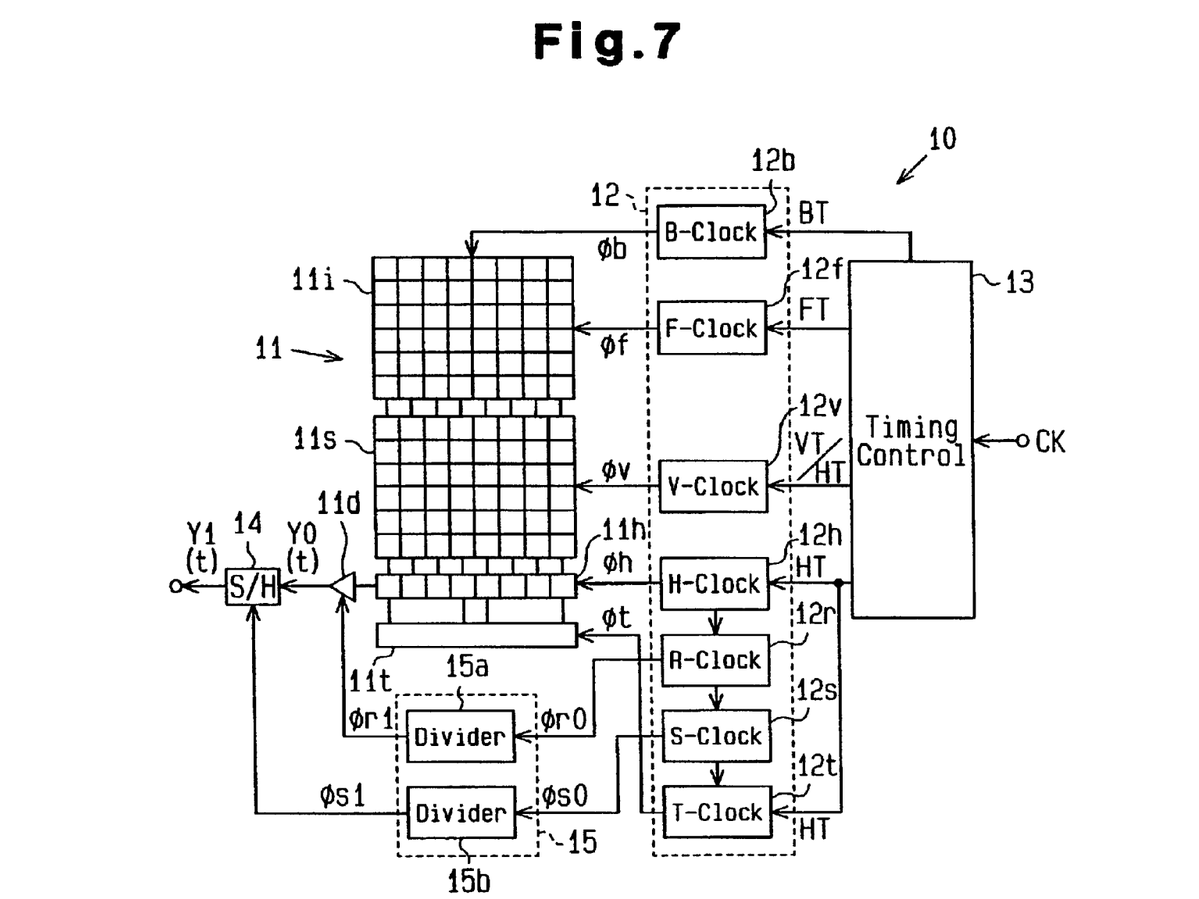
FIG. 7 is a schematic block diagram of an imaging apparatus employing the solid state imaging device of FIG. 3.

FIG. 7 is a schematic block diagram of an imaging apparatus incorporating the solid state imaging device 11 of the preferred embodiment. The structure of the solid state imaging device 11 is similar to the structure shown in FIG. 3 and includes, for example, a mosaic color filter. The solid state imaging device 11 includes a light receiving section 11$i$, which receives information charges corresponding to each color component, a storage section 11$s$, which temporarily accumulates information charges of a single screen image, a horizontal shift register 11$h$, which sequentially and horizontally outputs the information charges received in units of single rows, and a drain section 11$t$, which collects the information charges accumulated in predetermined bit regions of the horizontal shift register.

In response to a frame transfer timing signal FT, which is synchronized with the vertical scanning timing, the frame transfer clock generation circuit 12$f$ generates a frame transfer clock Φf, which has four-phases, and provides the frame transfer clock Φf to the light receiving section 11$i$. The vertical transfer clock generation circuit 12$v$ generates the vertical transfer clock Φv, which has four phases, and provides the vertical transfer clock Φv to the storage section 11$s$. In accordance with the vertical transfer clock Φv, the information charges transferred from the light receiving section 11$i$ in units of single screen images are received in the storage section 11$s$. The received information charges are transferred vertically in units of single rows.

The horizontal transfer clock generation circuit 12$h$ generates the transfer clock Φh, which has four phases and is synchronized with the horizontal synchronizing signal HT, and provides the horizontal transfer clock Φh to the horizontal shift register 11$h$. In accordance with the horizontal transfer clock Φh, the information charges transferred from the storage section 11$s$ in units of single rows are transferred horizontally in units of two pixels.

The drain clock generation circuit 12$t$ generates the single-phase drain clock Φt and provides the drain clock Φt to the drain section 11$t$. In accordance with the drain clock Φt, among the information charges received in each bit region of the horizontal shift register, the information charges received in a predetermined bit region are transferred to the drain region before being transferred to the drain region.

A reset clock generation circuit 12$r$, a sampling clock generation circuit 12$s$, a dividing circuit 15, and a sample hold circuit 14 have the same structure as the reset clock generation circuit 2$r$, the sampling clock generation circuit 2$s$, the dividing circuit 5, and the sample hold circuit 4 of the prior art. The circuits 12$r$, 12$s$, 14, and 15 reset the information charges output for every two pixels at a timing that is in accordance with the horizontal transfer cycle and sample-hold the output timing of the output section 11$d$. The dividing circuit 15 divides a reset clock Φr1 and a sampling clock Φs1 into cycles that are two times longer. The reset clock Φr1 and the sampling clock Φs1 correspond to the image signal Y0($t$), which is output in units of two pixels.

The timing control circuit 13 determines the vertical scanning and horizontal scanning timings in accordance with a clock signal CK, the cycle of which is constant, and control the operating timings of the clock generation circuits 12$f$, 12$v$, 12$h$.

Figure 8:
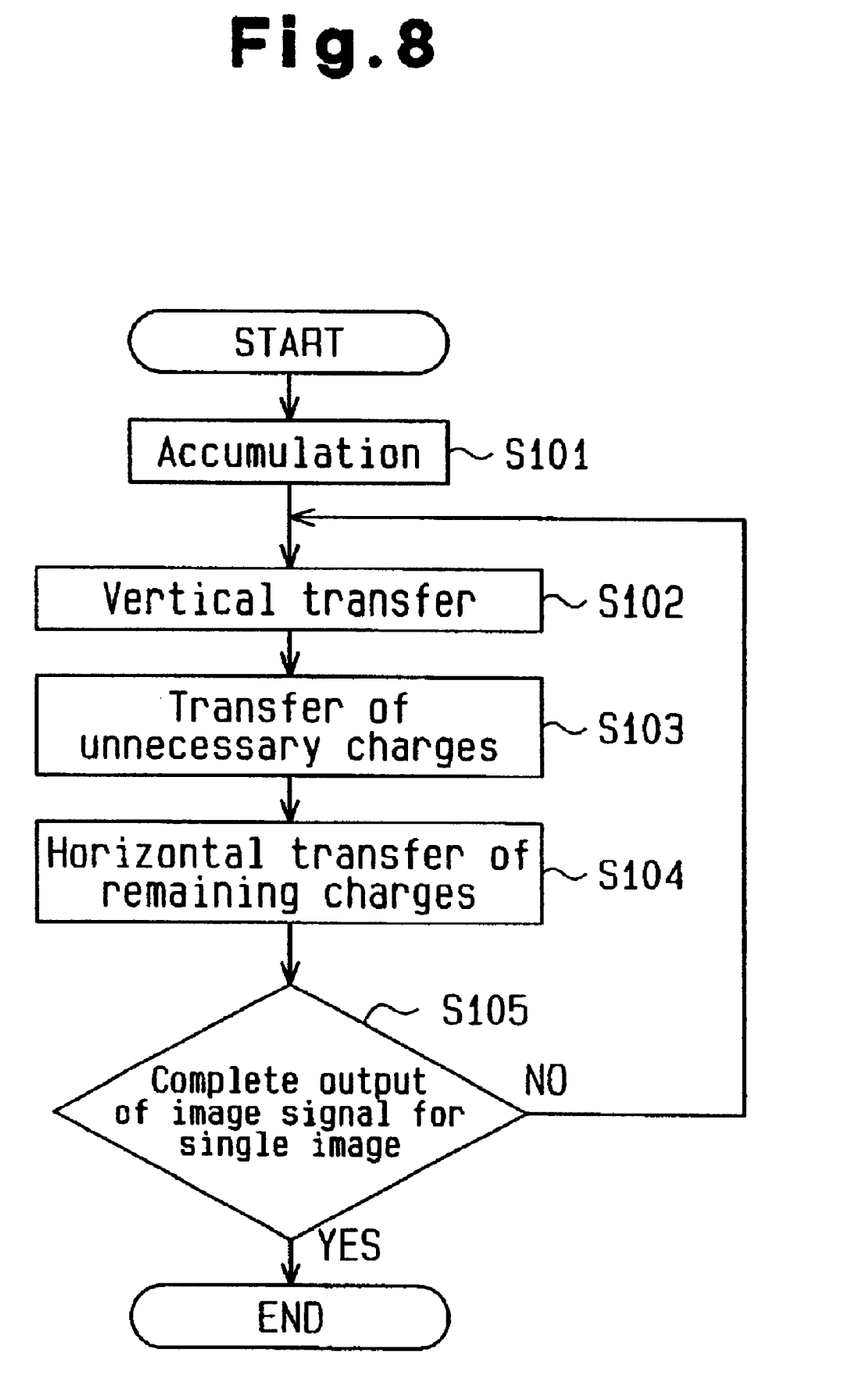
FIG. 8 is a flowchart illustrating the operation of the solid state imaging device of FIG. 3.

FIG. 8 is a flowchart illustrating the operation procedure of the solid state imaging device 11.

First, in step S101, a plurality of light receiving pixels arranged in the light receiving section 11$i$ of the solid state imaging device 11 generate information charges in response to the received light and accumulates the information charges. The accumulated information charges are then received in the vertical shift registers of the light receiving section 11$i$.

In the following step S102, the information charges for a single screen image that are received in a plurality of vertical shift registers are vertically transferred in units of single rows in accordance with a vertical transfer clock Φv. In this state, the information charges of each row of the vertical shift registers are provided to each bit region of the vertical shift register 11$h$, and the horizontal shift register 11$h$ receives information charges for a single row.

In step S103, the information charges accumulated in the two (k·(n−m)=2) bit regions that correspond to the same color component in every four (k·n=4) bit regions of the horizontal shift register 11$h$ are transferred to the drain section 11$t$. In this state, the information charges of a single row that are transferred to the horizontal shift register 11$h$ are thinned out in the horizontal direction at a rate of ½ m/n.

In step S104, among the four bit regions remaining in the horizontal shift register 11$h$ subsequent to the drain operation, the information charges of two of the bit regions are sequentially transferred in the horizontal direction in accordance with the horizontal transfer clock Φh. In this state, the information charges, which are thinned out horizontally by a ratio of ½, are sequentially transferred to the output section 11$d$. The output section 11$d$ converts the information charges to a voltage having a value corresponding to the charge amount of the information charges to generate the image signal Y0(t).

When information charges of a single screen image are not horizontally transferred in step S105, the process returns to step S102. Steps S102 to S104 are repeated until the information charges for a single screen image are converted to the image signal Y0($t$).

Figure 9:
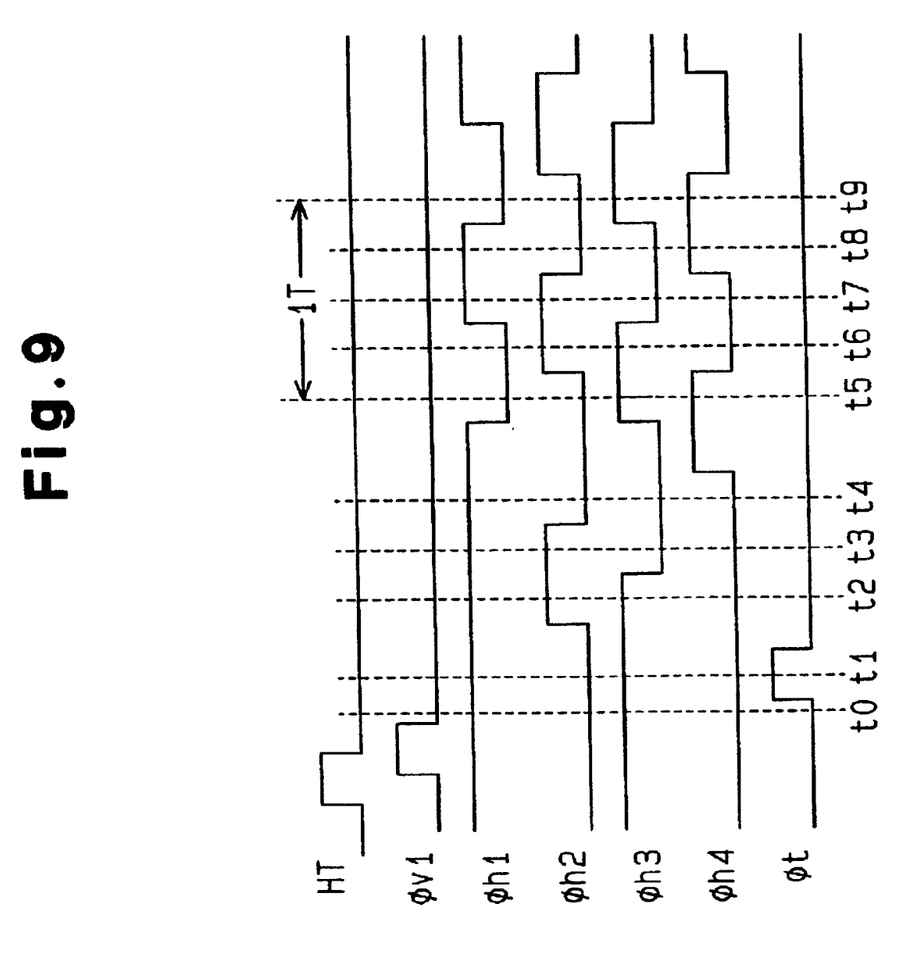
FIG. 9 is a timing chart illustrating the operating timing of steps S103 to S104 of FIG. 8.
Figure 10:
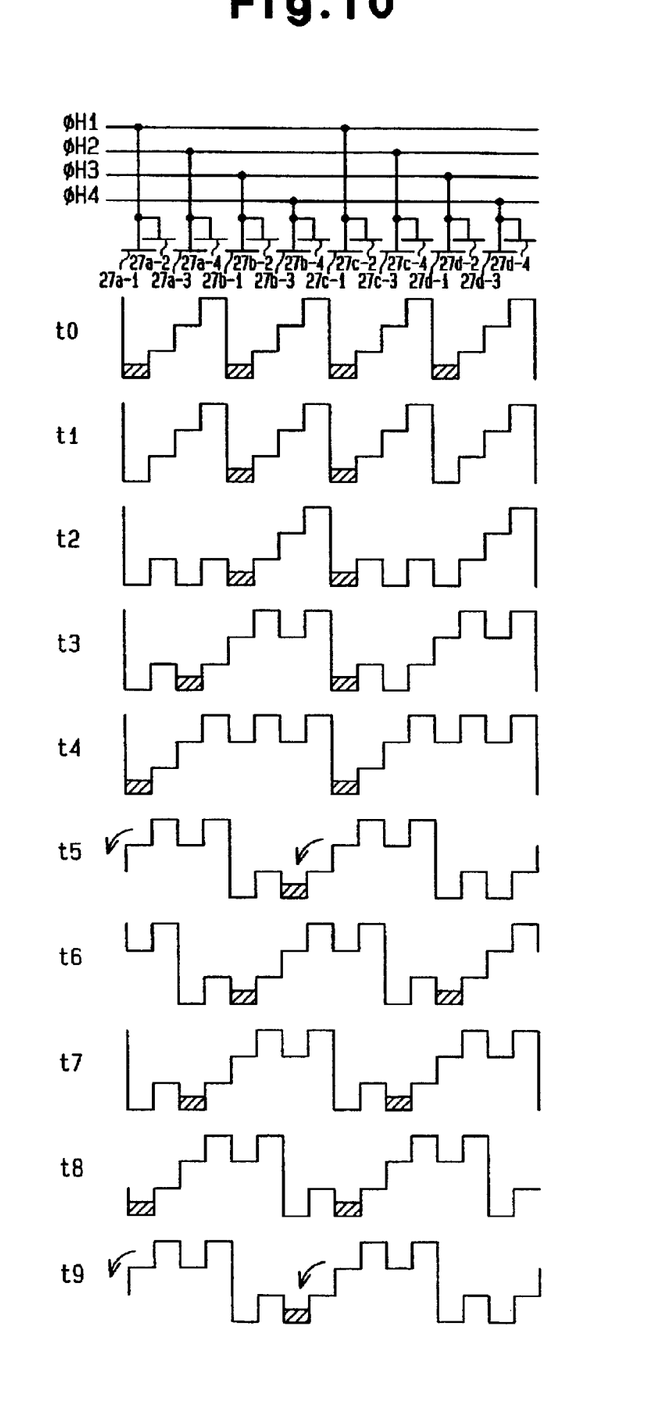
FIG. 10 is a potential chart illustrating potential states in steps S103 to S104 of FIG. 8.
Figure 11:
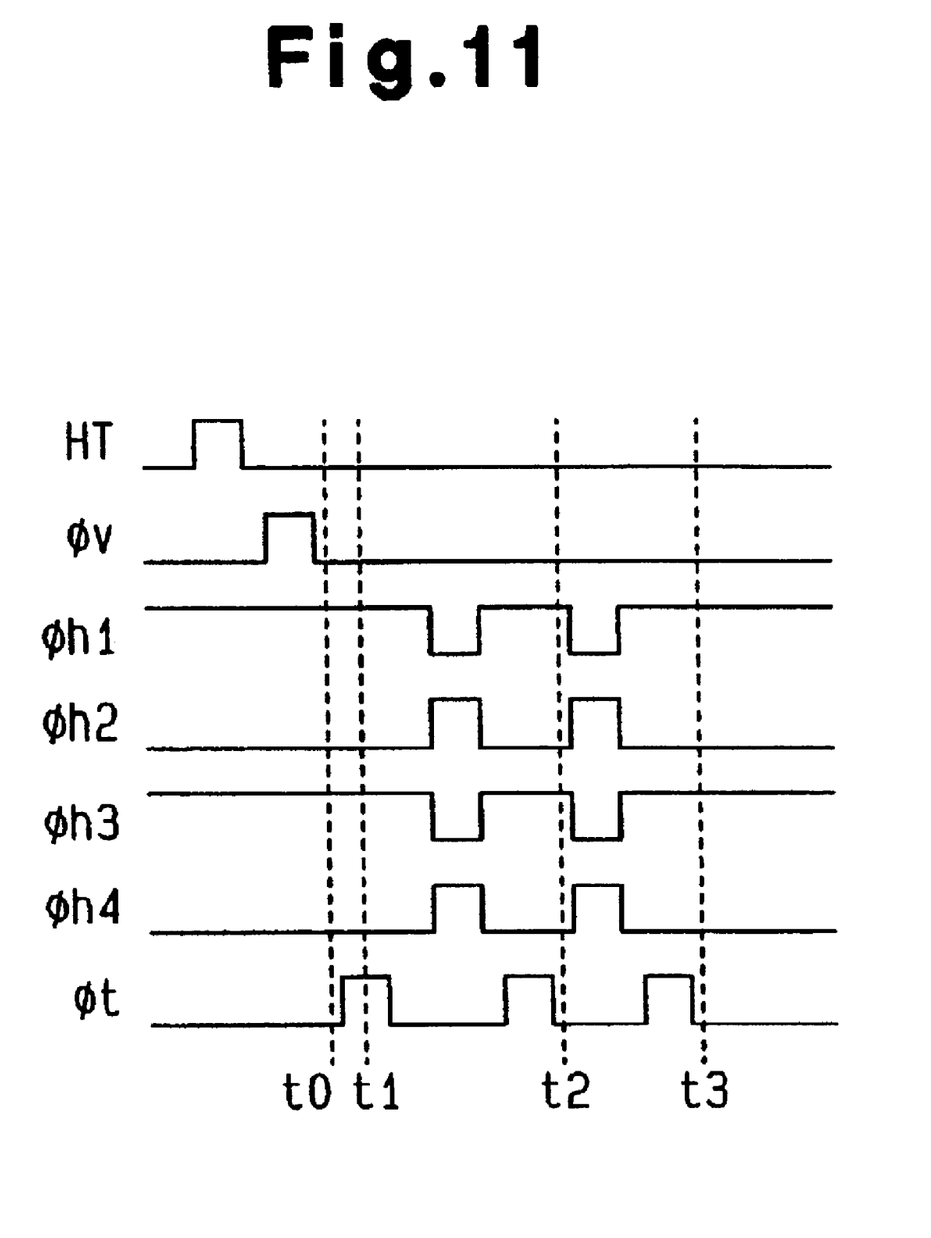
FIG. 11 is a timing chart illustrating an operating for thinning out information charges in the vertical direction.

FIG. 9 is a timing chart illustrating the operating timing of steps S103 and S104 of FIG. 8 and show the vertical transfer clock Φv, the horizontal transfer clock Φh, and the drain clock Φt. FIG. 11 is a potential chart illustrating potential states of the horizontal transfer channel 23 at each of the timings t0–t9 in FIG. 9. In this state, the vertical transfer clock Φv, which is actually four phases of clocks Φv1–Φv4, is represented only by the clock Φv1. Each of the horizontal transfer electrodes 27$a$-1–27$d$-4, for example, goes ON when the level of the provided clock is high and goes OFF when the level of the provided clock is low.

At timing t0, the horizontal transfer clocks Φh1, Φh3 are high and the horizontal transfer clocks Φh2, Φh4 are low. In this state, a potential well is formed in the horizontal transfer channel region below the four horizontal transfer electrodes 27$a$-1, 27$b$-1, 27$c$-1, 27$d$-1, which are provided with the high clock. Thus, the potential well accumulates the information charges transferred and output from each column of the vertical transfer channels 22$a$–22$d$ via the connection channels 30$a$–30$d$.

At timing t1, the drain clock Φt is high. In this state, the information charges accumulated in the horizontal transfer under the two horizontal transfer electrodes 27$a$-1, 27$d$-1 are transferred via the drain channel 25$a$, 25$d$ and received in the drain section. Thus, for the information charges of a single row that are transferred to the horizontal shift register 11$h$, among the information charges of the two pixels corresponding to the same color component, the information charges of only one of the pixels are disposed of. Accordingly, the information charges corresponding to each color component are thinned out horizontally at a ratio of ½.

At timing t2, when the horizontal transfer clock Φh2 goes high, the potential well is formed in the horizontal transfer channel region under the horizontal transfer electrodes 27$a$-3, 4, which is provided with the horizontal transfer clock Φh2. At timing t3, when the horizontal transfer clock Φh3 goes low, the horizontal transfer channel that is formed deeply under the horizontal transfer electrodes 27b-1, 2, which are provided with the horizontal transfer clock Φh3, becomes shallow. As a result, the information charges accumulated in the horizontal transfer electrodes are transferred to the potential well formed in the horizontal transfer channel under the horizontal transfer electrodes 27a-3, 4.

At timing t4, when the horizontal transfer clock Φh2 goes low, the horizontal transfer channel that is formed deeply under the horizontal transfer electrodes 27a-3, 4, which are provided with the horizontal transfer clock Φh2, becomes shallow. As a result, the information charges are transferred to the potential well formed in the horizontal transfer channel under the horizontal transfer electrodes 27a-1, 2. In this matter, the information charges, which are thinned out at a ratio of ½ in the horizontal direction, are temporarily accumulated in the channel region under the horizontal transfer electrodes 27a-1, 27c-1, which are temporarily provided with the first phase horizontal transfer clock Φh1, and then transferred.

At subsequent timings t5–t9, the horizontal transfer clocks Φh1–Φh4 change in a cyclic manner from high to low or from low to high. In accordance with the changes of the horizontal transfer clock Φh1–Φh4, the information charges accumulated in the horizontal transfer channel under the horizontal transfer electrodes 27a-1, 27c-1 are sequentially transferred in the horizontal direction. At timings t5–t9, during a single cycle 1T of the horizontal transfer clocks Φh1–Φh4, the information charges are transferred horizontally by a distance corresponding to eight electrodes, or to a region corresponding to two bit regions ahead of the horizontal shift register (the region two pixels ahead).

In this manner, in the information charges transferred to the horizontal shift register 11h, the information charges accumulated in one of the two bit regions corresponding to the same color component are disposed of. Thus, the information charges corresponding to each color component are thinned out by a ratio of ½. The thinned out information charges are transferred to be accumulated in the channel section under the transfer electrode that is provided with horizontal transfer clock Φh1. Afterward, in response to the four phase of the horizontal transfer clocks Φh1–Φh4, the thinned out information charges are sequentially provided to the output section 11d.

When thinning out the information charges received in the horizontal shift register 11h by ½, the information charges accumulated in one of the two bit regions corresponding to the same color component are disposed of. Thus, in the horizontal shift register 11h, the information charges are accumulated in units of two bit regions. The number of transfer stages of the horizontal shift register of the 11h is decreased by ½. Thus, the frequency of the horizontal transfer clock Φh may be set at ½ the frequency of the prior art in which reading is performed in units of single bit regions.

The present invention may be applied to thin out information charges, which are generated in a plurality of light receiving pixels, in the vertical direction as discussed below.

Figure 12:
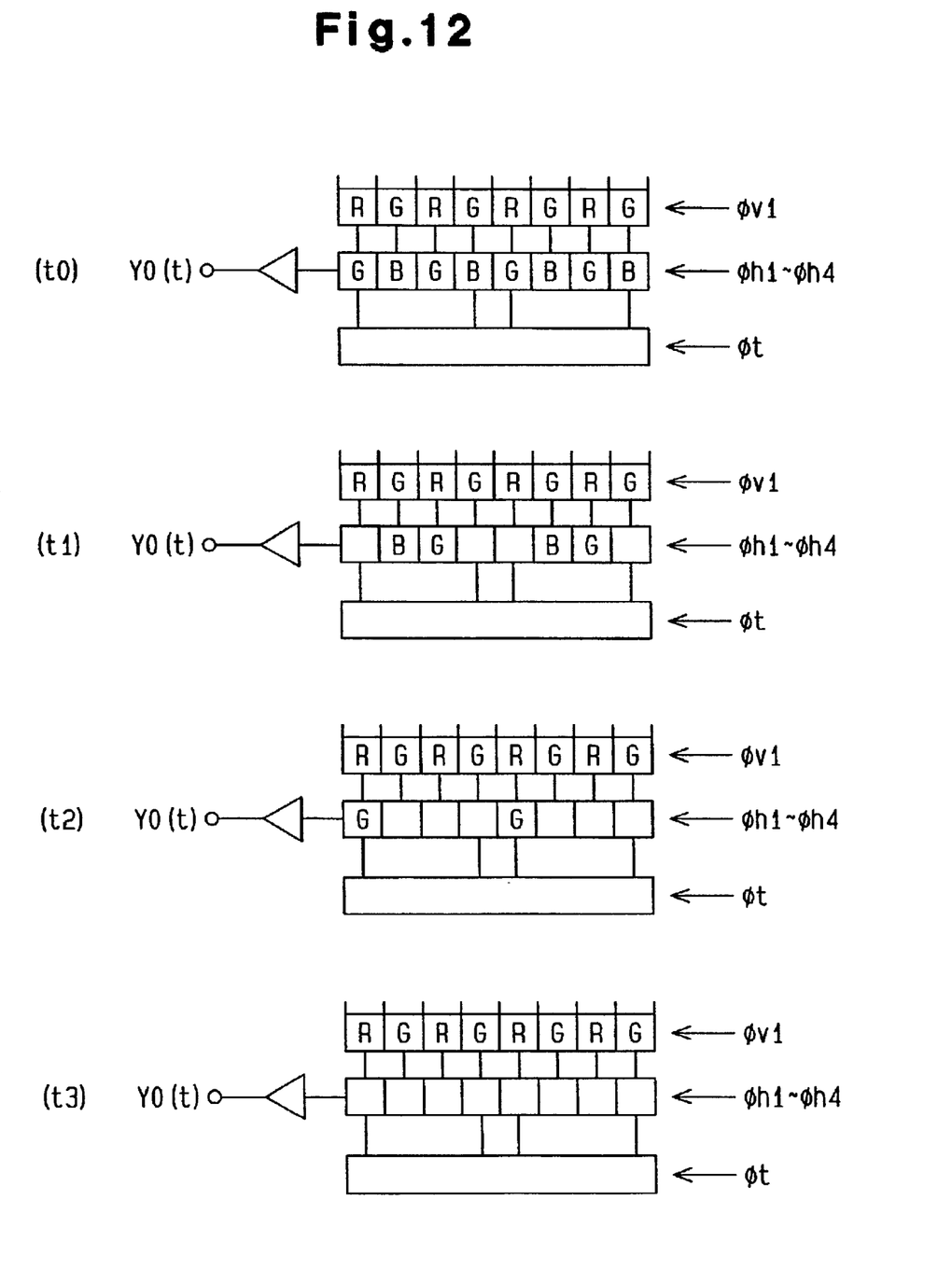
FIG. 12 is a schematic chart illustrating an operation for thinning out information charges in the vertical direction.

FIGS. 11 and 12 are charts illustrating the thinning of information charges, which are accumulated in the storage section 11s, in the vertical direction. FIG. 11 illustrates the vertical transfer clock Φv, the horizontal transfer clock Φh, and the drain clock Φt. FIG. 12 shows the state of the information charges transferred to the horizontal shift register 11h. Although the vertical transfer clock Φv is actually clocks of four phases only, one clock is shown in the drawings.

At timing t0, the information charges output from the storage section is are received in each bit region of the horizontal shift register 11h. At timing t1, the drain clock Φt goes high, and the information charges received in a predetermined bit region of the horizontal shift register, from which extends a transfer route extending to the drain section 11t, are transferred to the drain section. This drains the information charges accumulated in one of the two bit regions corresponding to the color component G and the information charges accumulated in one of the two bit regions corresponding to the color component B.

At timing t2, after transferring one stage of the information charges remaining in the horizontal shift register 11h, the drain operation is performed and the information charges received in the bit region corresponding to the other one of the two bit regions corresponding to the color component B are disposed of. At timing t3, after a horizontal transfer operation for one stage is further performed, the drain operation is performed, and the information charges received in the other one of the two bit regions corresponding to the color component G are disposed of. In this manner, all of information charges for a single row that are transferred to the horizontal shift register 11h are disposed of. Such operation is performed on a predetermined row, and information charges are thinned out in the vertical direction.

The solid state imaging device 11 of the preferred embodiment has the advantage described below.

The solid state imaging device 11 includes the drain section 11t, which collects and drains (disposes of) information charges transferred to each bit region of the horizontal shift register. By connecting two (k·(n−m=2)) bit regions of every four (k·n=4) bit regions to the drain section 11t, the information charges accumulated in the connected bit regions are disposed of. This thins out the information charges of a single row that are received in the horizontal shift register by ½ (m/n).

It should be apparent to those skilled in the art that the present invention may be embodied in many other specific forms without departing from the spirit or scope of the invention. Particularly, it should be understood that the present invention may be embodied in the following forms.

The information charges may be thinned out in the horizontal direction at a ratio of, for example, ⅔ (m=2, n=3), and the color components of three (k=3) colors may be associated with each row of the light receiving pixels. In this case, among the bit regions forming the horizontal transfer register 11h, one (n−m=1) of the three (n=3) bit regions corresponding to the same color component in every six (k·n=6) bit regions is connected to the drain section. In the present invention, the amount of the information charges that are thinned out in the horizontal direction and the number of colors of color components associated with each row of the light receiving pixels may be changed flexibly.

When reading the information charges of every pixel without thinning out information charges in the horizontal and vertical directions, the control electrodes 28 may be deactivated and the horizontal transfer clocks Φh1 and Φh3, which are provided to the horizontal transfer register 11h, may be switched to a common transfer clock. In this case, two phases of the horizontal shift register 11h are driven, and the information charges received in the horizontal shift register 11h are output and transferred sequentially in units of single pixels.

The present examples and embodiments are to be considered as illustrative and not restrictive, and the invention is not to be limited to the details given herein, but may be modified within the scope and equivalence of the appended claims.

What is claimed is:

1. A solid state imaging device comprising:
   a light receiving section including a plurality of light receiving pixels, wherein the light receiving pixels are arranged in rows and columns in a matrix-like manner and accumulate information charges;

a plurality of vertical shift registers connected to the light receiving section for transferring the information charges accumulated in the light receiving pixels in a vertical direction;

a horizontal shift register connected to the vertical shift registers and including a plurality of bit regions, wherein the bit regions receive information charges transferred from the vertical shift registers, and the horizontal shift register transfers the information charges accumulated in the light receiving pixels in a horizontal direction at a ratio of m/n (m, n both being natural numbers and satisfying m<n);

an output section connected to an output of the horizontal shift register, wherein the output section receives the information charges transferred in the horizontal direction and generates an image signal having a voltage corresponding to the charge amount of the information charges; and a drain section connected to the horizontal shift register for collecting the information charges received in the horizontal shift register;

wherein the drain section is connected to a k·(n−m) (k being an integer equal to or greater than two) number of the bit regions in a k·n number of bit regions of the horizontal shift register, and the horizontal shift register transfers the information charges of the k·(n−m) number of the bit regions in the k·n number of bit regions to the drain section, wherein the pixels of each row are each associated with one of a k number of color components, the color components being associated with the pixels in each row in a predetermined order, and wherein the drain section is connected to an (n−m) number of an n number of bit regions associated with the same color component in the k·n number of bit regions.

2. The solid state imaging device according to claim 1, wherein the drain section includes:

a control electrode for controlling transfer of the information charges from the horizontal shift register; and a drain region for receiving the information charges that are transferred.

3. A solid state imaging device comprising:

a light receiving section including a plurality of light receiving pixels, wherein the light receiving pixels are arranged in rows and columns in a matrix-like manner and accumulate information charges;

a plurality of vertical shift registers connected to the light receiving section for transferring the information charges accumulated in the light receiving pixels in a vertical direction;

a horizontal shift register connected to the vertical shift registers and including a plurality of bit regions, wherein the bit regions receive information charges transferred from the vertical shift registers, and the horizontal shift register transfers the received information charges in a horizontal direction;

an output section connected to an output of the horizontal shift register, wherein the output section receives the information charges transferred in the horizontal direction and generates an image signal having a voltage corresponding to the charge amount of the information charges; and a drain section connected to the horizontal shift register for collecting the information charges received in the horizontal shift register;

wherein the drain section is connected to some of the bit regions of the horizontal shift register, and wherein the horizontal shift register transfers the information charges of the some of the bit regions to the drain section and transfers the information charges of the remaining bit regions to the output section, wherein the pixels of each row are each associated with one of a plurality of color components, the plurality of color components being associated with the pixels in each row in a predetermined order, and wherein:

the drain section is connected to a first predetermined number of the bit regions in a second predetermined number of the bit regions of the horizontal shift register for each of the plurality of color components, the first predetermined number being less than the second predetermined number; and the horizontal shift register transferring the information charges of the first predetermined number of the bit regions in the second predetermined number of the bit regions to the drain section and transferring the information charges of the remaining bit regions to the output section.

4. A method for driving a solid state imaging device including a plurality of light receiving pixels, wherein the light receiving pixels are arranged in rows and columns in a matrix-like manner and accumulate information charges, wherein the pixels of each row are each associated with one of a k number of color components (k being an integer equal to or greater than two), the k number of color components being associated with the pixels in each row in a predetermined order, wherein the solid state imaging device thins out the information charges in a horizontal direction at a ratio of m/n (m, n both being natural numbers and satisfying m<n) and outputs the thinned out information charges, and wherein the solid state imaging device includes a plurality of vertical shift registers, a horizontal shift register having a plurality of bit regions connected to the vertical shift registers, an output section connected to an output of the horizontal shift register, and a drain section connected to a (n−m) number of bit regions in a k·n number of the bit regions of the horizontal shift register for each of the k number of color components, the method comprising the steps of:

receiving the information charges accumulated in the light receiving pixels with the vertical shift registers;

vertically transferring the information charges received in the vertical shift registers to the horizontal shift register in units of single rows;

transferring the information charges of the k·(n−m) number of bit regions in the k·n number of the bit regions to the drain section; and horizontally transferring the information charges of a k·m number of the bit regions in the k·n number of the bit regions to the output section.

5. The method according to claim 4, further comprising the steps of:

horizontally transferring the information charges of the k·m number of the bit regions in the k·n number of the bit regions to the bit regions connected to the drain section;

transferring the information charges of the k·m number of the bit regions in the k·n number of the bit regions to the drain section; and collecting all of the information charges of a single row that is transferred to the horizontal shift register.

* * * * *